United States Patent
Sypolt et al.

(10) Patent No.: US 9,253,895 B2
(45) Date of Patent: Feb. 2, 2016

(54) ELECTRICAL ASSEMBLY

(71) Applicant: Tyco Electronics Corporation, Berwyn, PA (US)

(72) Inventors: Matthew Sypolt, Harrisburg, PA (US); Vince Reydams, Harrisburg, PA (US); Dennis Perzacki, Harrisburg, PA (US); Peter P. Wilson, Palmyra, PA (US); David Mendez, Austin, TX (US)

(73) Assignee: Tyco Electronics Corporation, Berwyn, PA (US)

( * ) Notice: Subject to any disclaimer, the term of this patent is extended or adjusted under 35 U.S.C. 154(b) by 201 days.

(21) Appl. No.: 14/154,932

(22) Filed: Jan. 14, 2014

(65) Prior Publication Data
US 2015/0201514 A1 Jul. 16, 2015

(51) Int. Cl.
| H05K 7/00 | (2006.01) |
| H05K 3/32 | (2006.01) |
| C09J 9/02 | (2006.01) |
| H05K 3/28 | (2006.01) |
| H05K 3/30 | (2006.01) |

(52) U.S. Cl.
CPC . *H05K 3/321* (2013.01); *C09J 9/02* (2013.01); *H05K 3/284* (2013.01); *H05K 3/30* (2013.01); *H05K 2201/10977* (2013.01); *H05K 2203/1311* (2013.01)

(58) Field of Classification Search
USPC .......................... 361/760, 748, 807, 761, 762
See application file for complete search history.

(56) References Cited

U.S. PATENT DOCUMENTS

| 5,386,624 | A | 2/1995 | George et al. |
| 8,525,321 | B2 | 9/2013 | Kumar et al. |
| 8,649,183 | B2* | 2/2014 | Green .................... H05K 1/182 174/260 |
| 2005/0121806 | A1 | 6/2005 | Sangiorgi |
| 2014/0327994 | A1* | 11/2014 | Koyama ................. H02H 3/08 361/93.1 |

FOREIGN PATENT DOCUMENTS

EP 1 153 985 A1 11/2001

OTHER PUBLICATIONS

Internatational Search Report, International Application No. PCT/US2014/072624, International Filing Date, Dec. 30, 2014.

* cited by examiner

*Primary Examiner* — Andargie M Aychillhum

(57) ABSTRACT

An electrical assembly includes a first lead, a second lead, and an electrical component extending from a first end to a second end. A first non-electrically conductive adhesive member mechanically connects the first lead to the first end of the electrical component. A second non-electrically conductive adhesive member mechanically connects the second lead to the second end of the electrical component. A first electrically conductive adhesive member electrically connects the first lead to the first end of the electrical component. A second electrically conductive adhesive member electrically connects the second lead to the second end of the electrical component.

17 Claims, 9 Drawing Sheets

ELECTRICAL ASSEMBLY

BACKGROUND OF THE INVENTION

The subject matter described and/or illustrated herein relates generally to an electrical assembly, and more particularly to an electrical component that is connected between two electrical leads.

Electrical components are sometimes connected between the ends of two electrical leads to provide an electrical pathway between the leads. An assembly of the electrical component and the leads may be referred to as an "electrical assembly". Within known electrical assemblies, the electrical component is electrically and mechanically connected across the ends of the leads using an electrically conductive epoxy that joins the electrical component to the leads. But, the electrically conductive epoxy may not have sufficient strength to withstand mechanical stresses experienced by the assembly during subsequent handling and processing operations. For example, such subsequent handling and processing operations may include, but are not limited to, overmold operations, assembly operations, operations performed on an electrical connector and/or other electrical device within which the electrical assembly is embedded, and/or the like. The mechanical stresses exerted on the electrically conductive epoxy may cause the electrically conductive epoxy to crack, sever, break, and/or otherwise fail, which may break the electrical and/or mechanical connection between the leads. Moreover, the electrically conductive epoxy may electrically short the leads together, which may cause the electrical assembly to be scrapped during manufacturing.

BRIEF DESCRIPTION OF THE INVENTION

In one embodiment, an electrical assembly includes a first lead, a second lead, and an electrical component extending from a first end to a second end that is opposite the first end. A first non-electrically conductive adhesive member joins the first lead to the first end of the electrical component such that the first non-electrically conductive adhesive member mechanically connects the first lead to the first end of the electrical component. A second non-electrically conductive adhesive member joins the second lead to the second end of the electrical component such that the second non-electrically conductive adhesive member mechanically connects the second lead to the second end of the electrical component. A first electrically conductive adhesive member joins the first lead to the first end of the electrical component such that the first electrically conductive adhesive member electrically connects the first lead to the first end of the electrical component. A second electrically conductive adhesive member joins the second lead to the second end of the electrical component such that the second electrically conductive adhesive member electrically connects the second lead to the second end of the electrical component.

In an embodiment, an electrical connector includes an electrically insulative body, and a lead frame held by the body. The lead frame includes first and second leads. An electrical assembly is embedded within the lead frame. The electrical assembly includes an electrical component extending from a first end to a second end that is opposite the first end, a first non-electrically conductive adhesive member joining the first lead to the first end of the electrical component such that the first non-electrically conductive adhesive member mechanically connects the first lead to the first end of the electrical component, a second non-electrically conductive adhesive member joining the second lead to the second end of the electrical component such that the second non-electrically conductive adhesive member mechanically connects the second lead to the second end of the electrical component, a first electrically conductive adhesive member joining the first lead to the first end of the electrical component such that the first electrically conductive adhesive member electrically connects the first lead to the first end of the electrical component, and a second electrically conductive adhesive member joining the second lead to the second end of the electrical component such that the second electrically conductive adhesive member electrically connects the second lead to the second end of the electrical component.

In an embodiment, an electrical assembly includes a first lead and a second lead. The first and second leads are spaced apart by a gap. An electrical component extends from a first end to a second end that is opposite the first end. A non-electrically conductive adhesive member joins the first lead to the first end of the electrical component such that the non-electrically conductive adhesive member mechanically connects the first lead to the first end of the electrical component. The non-electrically conductive adhesive member joins the second lead to the second end of the electrical component such that the non-electrically conductive adhesive member mechanically connects the second lead to the second end of the electrical component. The non-electrically conductive adhesive member joins the first and second leads together across the gap. A first electrically conductive adhesive member joins the first lead to the first end of the electrical component such that the first electrically conductive adhesive member electrically connects the first lead to the first end of the electrical component. A second electrically conductive adhesive member joins the second lead to the second end of the electrical component such that the second electrically conductive adhesive member electrically connects the second lead to the second end of the electrical component.

DETAILED DESCRIPTION OF THE INVENTION

Figure 1:
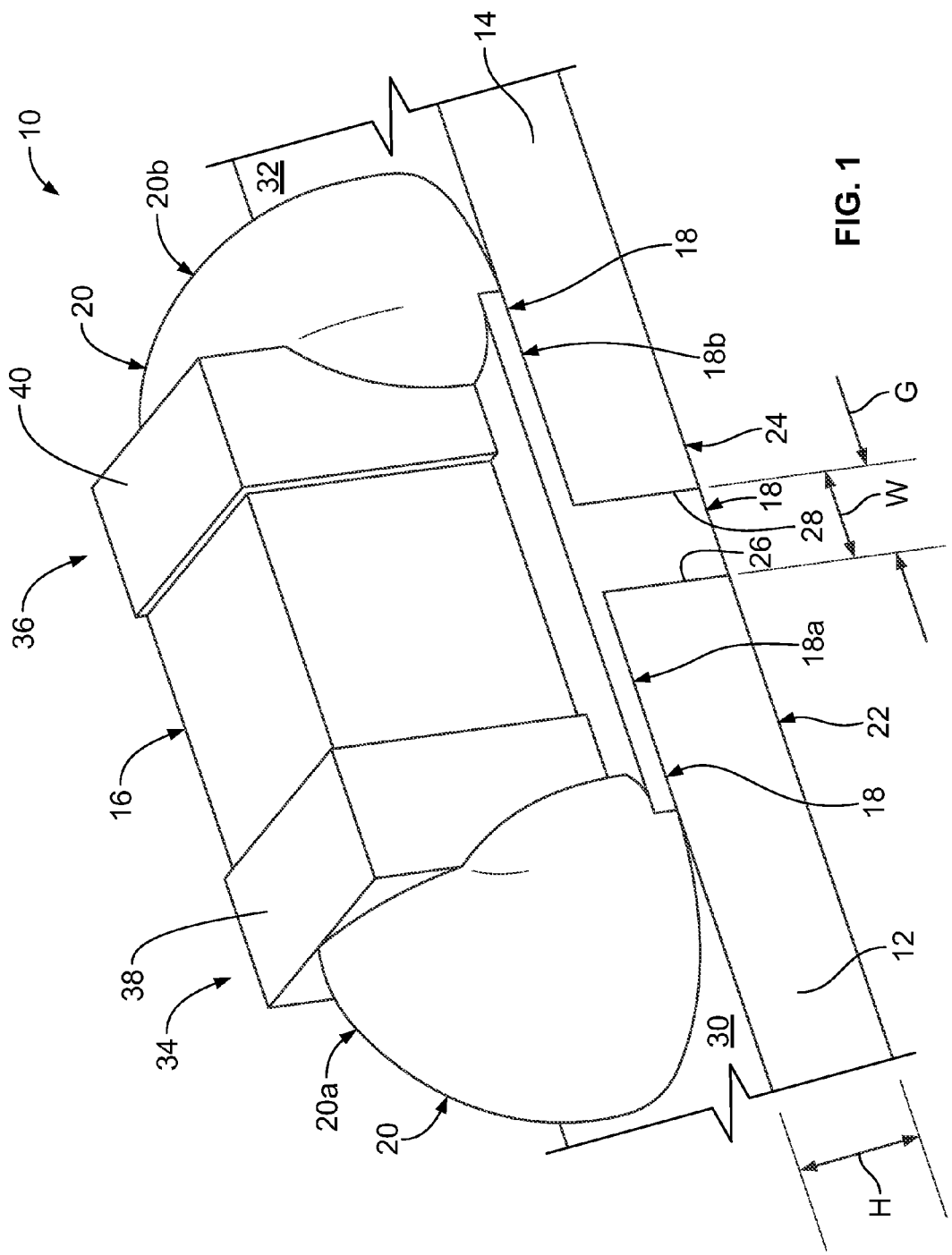
FIG. 1 is a perspective view of an embodiment of an electrical assembly.

FIG. 1 is a perspective view of an embodiment of an electrical assembly 10. The electrical assembly 10 includes electrical leads 12 and 14 and an electrical component 16 that electrically connects the leads 12 and 14 together. As will be described below, the electrical component 16 is mechanically connected to the leads 12 and 14 using one or more non-electrically conductive adhesive members 18 and the electrical component 16 is electrically connected to the leads 12 and 14 using electrically conductive adhesive members 20. Each of the leads 12 and 14 may be referred to herein as a "first lead" and/or a "second lead".

The leads 12 and 14 include respective ends 22 and 24 that have respective end faces 26 and 28. As can be seen in FIG. 1, the leads 12 and 14 are spaced apart by a gap G. Specifically, the end faces 26 and 28 of the leads 12 and 14, respectively, are spaced apart from each other by the gap G. The ends 22 and 24 of the leads 12 and 14, respectively, also include respective lead surfaces 30 and 32. Each of the lead surfaces 30 and 32 may be referred to herein as a "first lead surface" and/or a "second lead surface".

The electrical component 16 extends from an end 34 to an end 36 that is opposite the end 34. In the illustrated embodiment of the assembly 10, the electrical component 16 is a capacitor. The capacitor of the electrical component 16 may be any type of capacitor having any overall construction, such as, but not limited to, parallel plate capacitors, fixed capacitors, variable capacitors, gimmick capacitors, trimmer capacitors, electrolytic capacitors, printed circuit board capacitors, integrated circuit capacitors, vacuum capacitors, active capacitors, passive capacitors, and/or the like. Optionally, the capacitor of the electrical component 16 is configured to facilitate blocking direct current (DC).

The electrical component 16 is not limited to being or including a capacitor. Rather, in addition or alternatively to the capacitor, the electrical component 16 may include any other type of electrical component that provides an electrical pathway between the leads 12 and 14. Examples of the electrical component 16 include, but are not limited to, capacitors, resistors, diodes, transistors, transducers, switches, active electrical components, passive electrical components, and/or the like.

In the illustrated embodiment of the assembly 10, the electrical component 16 has the shape of a parallelepiped. But, additionally or alternatively, the electrical component 16 may include any other shape. Optionally, the electrical component 16 includes a cap 38 on the end 34 and/or a cap 40 on the end 36. The caps 38 and/or 40 are optionally formed from different materials than one or more other portions of the electrical component 16. For example, in some embodiments, the caps 38 and 40 are formed from a metallic material, and one or more other portions of the electrical component 16 are formed from a ceramic material. In addition or alternative to the metallic and ceramic materials, the caps 38 and 40 and the other portions of the electrical component 16 may each include any other material. Each of the ends 34 and 36 of the electrical component 16 may be referred to herein as a "first end" and/or a "second end".

As briefly described above, the electrical component 16 is mechanically connected to the leads 12 and 14 using the non-electrically conductive adhesive member(s) 18. In the illustrated embodiment of the assembly 10, the electrical component 16 is mechanically connected to the leads 12 and 14 using two non-electrically conductive adhesive members 18a and 18b. Specifically, in the illustrated embodiment of the assembly 10, the non-electrically conductive adhesive member 18a joins the lead surface 30 of the lead 12 to the end 34 of the electrical component 16. The non-electrically conductive adhesive member 18a thereby mechanically connects the lead 12 to the end 34 of the electrical component 16. In the illustrated embodiment of the assembly 10, the non-electrically conductive adhesive member 18a joins the lead surface 30 of the lead 12 to the cap 38 at the end 34 of the electrical component 16 to mechanically connect the lead 12 to the end 34 of the electrical component 16. The non-electrically conductive adhesive member 18a is not limited to joining the lead surface 30 of the lead 12 to the electrical component 16. Rather, in addition or alternatively to the lead surface 30, the non-electrically conductive adhesive member 18a may join any other surface of the lead 12 to the electrical component 16 to mechanically connect the lead 12 to the electrical component 16. The non-electrically conductive adhesive member 18a may be referred to herein as a "first non-electrically conductive adhesive member" and/or a "second non-electrically conductive adhesive member".

The non-electrically conductive adhesive member 18b joins the lead surface 32 of the lead 14 to the end 36 of the electrical component 16 such that the non-electrically conductive adhesive member 18b mechanically connects the lead 14 to the end 36 of the electrical component 16. The non-electrically conductive adhesive member 18b joins the lead surface 32 of the lead 14 to the cap 40 at the end 36 of the electrical component 16 in the illustrated embodiment of the assembly 10. The non-electrically conductive adhesive member 18b is not limited to joining the lead surface 32 of the lead 14 to the electrical component 16. Rather, in addition or alternatively to the lead surface 32, the non-electrically conductive adhesive member 18b may join any other surface of the lead 14 to the electrical component 16 to mechanically connect the lead 14 to the electrical component 16. The non-electrically conductive adhesive member 18b may be referred to herein as a "first non-electrically conductive adhesive member" and/or a "second non-electrically conductive adhesive member".

Optionally, the non-electrically conductive adhesive members 18a and/or 18b extend within the gap G. The non-electrically conductive adhesive members 18a and/or 18b may fill any amount of the gap G, such as any amount of the width W of the gap G, any amount of the height H of the gap G, and any amount of the length L (FIG. 2) of the gap G. In other words, the non-electrically conductive adhesive members 18a and/or 18b may fill any amount of the three-dimensional (3D) space defined by the gap G. Optionally, the non-electrically conductive adhesive members 18a and/or 18b join (i.e., mechanically connect) the end faces 26 and 28 of the respective leads 12 and 14 together across the gap, which may provide further (i.e., a stronger) mechanical connection between the leads 12 and 14 as compared to the mechanical connections provided between the lead surfaces 30 and 32 and the ends 34 and 36, respectively, of the electrical component 16. In the illustrated embodiment of the assembly 10, the non-electrically conductive adhesive members 18a and 18b define a continuous structure across the gap G that fills an approximate entirety of the 3D space of the gap G. Alternatively, the non-electrically conductive adhesive members 18a and 18b are not joined together within the gap G (or otherwise) such that the non-electrically conductive adhesive members 18a and 18b do not define a continuous structure. The non-electrically conductive adhesive members 18a and/or 18b optionally protrude from the gap G.

The non-electrically conductive adhesive members 18a and 18b may each be any type of adhesive that is not electrically conductive and that includes any material(s), such as, but not limited to, an epoxy, a thermosetting polymer, a mechanically bonding adhesive, a chemically bonding adhesive, and/or the like. In some embodiments, the non-electrically conductive adhesive members 18a and 18b have the same material composition as each other, while in other embodiments the non-electrically conductive adhesive members 18a and 18b have a different material composition than each other.

As also briefly described above, the electrical component 16 is electrically connected to the leads 12 and 14 using the electrically conductive adhesive members 20. Specifically, the electrical component 16 is electrically connected to the leads 12 and 14 using two electrically conductive adhesive members 20a and 20b. The electrically conductive adhesive member 20a joins the lead surface 30 of the lead 12 to the end 34 of the electrical component 16 such that the electrically conductive adhesive member 20a electrically connects the lead 12 to the end 34 of the electrical component 16. In the illustrated embodiment of the assembly 10, the electrically conductive adhesive member 20a joins the lead surface 30 of the lead 12 to the cap 38 at the end 34 of the electrical component 16 to electrically connect the lead 12 to the end 34 of the electrical component 16. The electrically conductive adhesive member 20a is not limited to joining the lead surface 30 of the lead 12 to the electrical component 16. Rather, in addition or alternatively to the lead surface 30, the electrically conductive adhesive member 20a may join any other surface of the lead 12 to the electrical component 16 to electrically connect the lead 12 to the electrical component 16. The electrically conductive adhesive member 20a may be referred to herein as a "first electrically conductive adhesive member" and/or a "second electrically conductive adhesive member".

The electrically conductive adhesive member 20b joins the lead surface 32 of the lead 14 to the end 36 of the electrical component 16. The electrically conductive adhesive member 20b thereby electrically connects the lead 14 to the end 36 of the electrical component 16. In the illustrated embodiment of the assembly 10, the electrically conductive adhesive member 20b joins the lead surface 32 of the lead 14 to the cap 40 at the end of the electrical component 16. The electrically conductive adhesive member 20b is not limited to joining the lead surface 32 of the lead 14 to the electrical component 16. Rather, in addition or alternatively to the lead surface 32, the electrically conductive adhesive member 20b may join any other surface of the lead 14 to the electrical component 16 to electrically connect the lead 14 to the electrical component 16. The electrically conductive adhesive member 20b may be referred to herein as a "first electrically conductive adhesive member" and/or a "second electrically conductive adhesive member".

The electrically conductive adhesive members 20a and 20b may each be any type of adhesive that is electrically conductive and that includes any material(s), such as, but not limited to, an electrically conductive epoxy, an electrically conductive thermosetting polymer, solder a mechanically bonding adhesive, a chemically bonding adhesive, and/or the like. In some embodiments, the electrically conductive adhesive members 20a and 20b have the same material composition as each other, while in other embodiments the electrically conductive adhesive members 20a and 20b have a different material composition than each other.

In the illustrated embodiment of the assembly 10, each of the non-electrically conductive adhesive members 18a and 18b extends between the respective lead surface 30 and 32 and the respective electrically conductive adhesive member 20a and 20b. In other words, the electrically conductive adhesive members 20a and 20b extend over the respective non-electrically conductive adhesive member 18a and 18b. Alternatively, each of the electrically conductive adhesive members 20a and 20b extends between the respective lead surface 30 and 32 and the respective non-electrically conductive adhesive member 18a and 18b (e.g., the arrangement of the electrical assembly 110 shown in FIG. 5).

Optionally, an electrically insulative material (not shown) is provided that encapsulates at least a portion of the electrical assembly 10, such as, but not limited to, the electrical component 16, the non-electrically conductive adhesive members 18a and 18b, the electrically conductive adhesive members 20a and 20b, and at least a portion of the leads 12 and 14 (e.g., the ends 22 and 24 of the leads 12 and 14, respectively). For example, the electrically insulative material may be an overmold that is molded over at least a portion of the electrical assembly 10.

Figure 2:
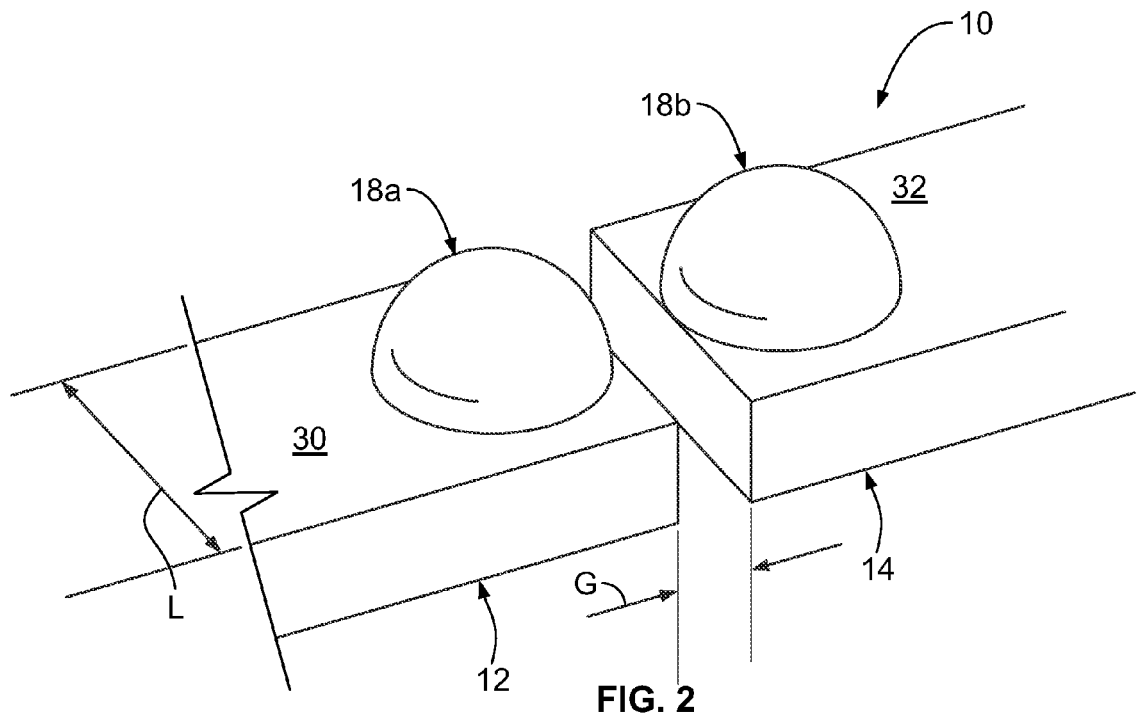
FIGS. 2-4 are perspective views of portions of the electrical assembly shown in FIG. 1 illustrating an exemplary process for fabricating the assembly.
Figure 3:
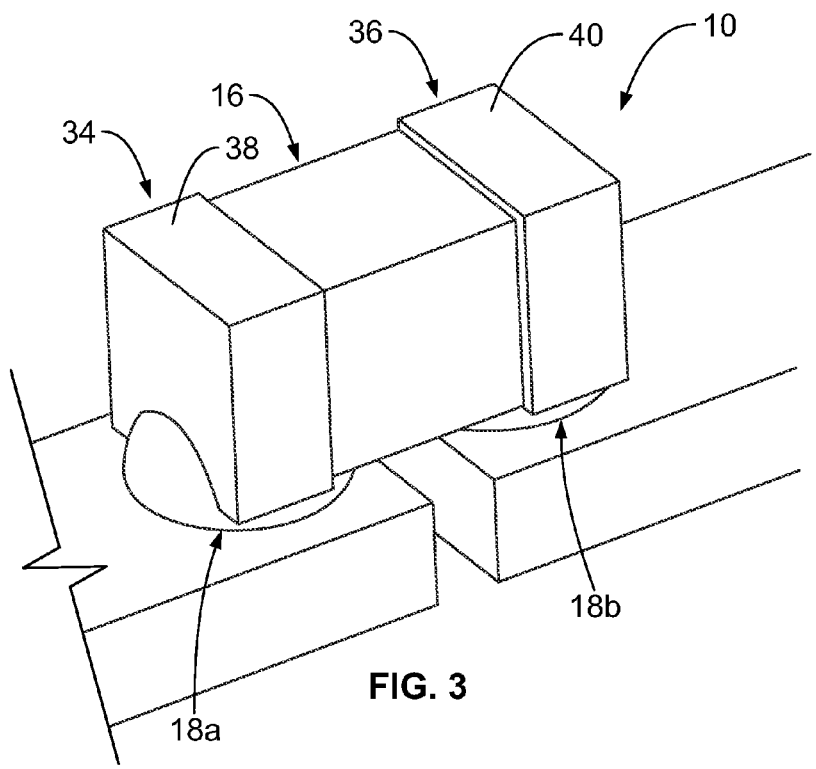
Figure 4:
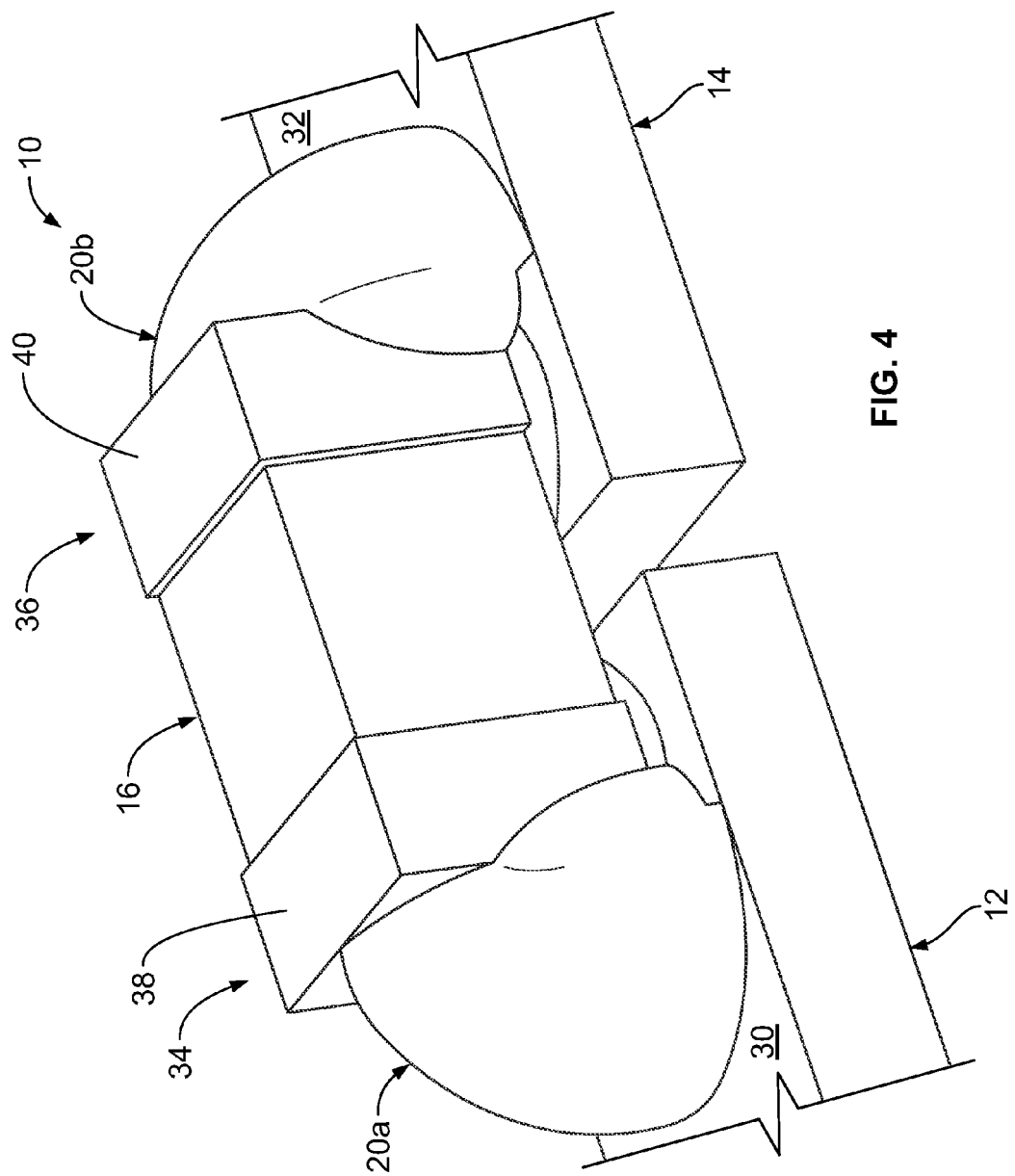

FIGS. 2-4 are perspective views of portions of the electrical assembly 10 illustrating an exemplary process for fabricating the assembly 10. As shown in FIG. 2, a dot of a non-electrically conductive adhesive material is applied to the lead surface 30 of the lead 12 to provide the non-electrically conductive adhesive member 18a. Similarly, a dot of a non-electrically conductive adhesive material is applied to the lead surface 32 of the lead 14 to provide the non-electrically conductive adhesive member 18b. Alternatively, a single dot of a non-electrically conductive adhesive material may be applied to both the lead surfaces 30 and 32 to provide the non-electrically conductive adhesive members 18a and 18b (e.g., as a single continuous structure that extends over the gap G).

As shown in FIG. 3, the electrical component 16 is placed on the non-electrically conductive adhesive members 18a and 18b. Specifically, the electrical component 16 is positioned on the non-electrically conductive adhesive members 18a and 18b such that the end 34 of the electrical component 16 is engaged in physical contact with the non-electrically conductive adhesive member 18a and such that the end 36 of the electrical component 16 is engaged in physical contact with the non-electrically conductive adhesive member 18b. In the illustrated embodiment, the cap 38 at the end 34 of the electrical component 16 is engaged in physical contact with the non-electrically conductive adhesive member 18a and the cap 40 at the end 36 of the electrical component 16 is engaged in physical contact with the non-electrically conductive adhesive member 18b.

As shown in FIG. 4, a dot of an electrically conductive adhesive material is applied to the lead 12 and the electrical component 16 to provide the electrically conductive adhesive member 20a. Specifically, the electrically conductive adhesive material is applied to the lead 12 and the electrical component 16 such that the electrically conductive adhesive member 20a is engaged in physical contact with the lead surface 30 of the lead 12 and is engaged in physical contact with the end 34 of the electrical component 16. In the illustrated embodiment, the electrically conductive adhesive member 20a is engaged in physical contact with the cap 38 at the end 34 of the electrical component 16.

A dot of an electrically conductive adhesive material is also applied to the lead 14 and the electrical component 16 to provide the electrically conductive adhesive member 20b, as is also shown in FIG. 4. Specifically, the electrically conductive adhesive material is applied to the lead 14 and the electrical component 16 such that the electrically conductive adhesive member 20b is engaged in physical contact with the lead surface 32 of the lead 14 and is engaged in physical contact with the end 36 of the electrical component 16. In the illustrated embodiment, the electrically conductive adhesive member 20b is engaged in physical contact with the cap 40 at the end 36 of the electrical component 16.

The adhesive members 18a, 18b, 20a, and/or 20b can then be cured to provide the electrical assembly 10 shown in FIG. 1. Referring now to FIG. 1, the non-electrically conductive adhesive members 18a and 18b are joined to the respective lead surfaces 30 and 32 and the electrical component 16 such that the non-electrically conductive adhesive members 18a and 18b mechanically connect the electrical component 16 between the ends 22 and 24 of the leads 12 and 14, respectively. As can be seen from a comparison of FIGS. 1 and 4, in the illustrated embodiment of the assembly 10, the non-electrically conductive adhesive members 18a and/or 18b have flowed into the gap G between the leads 12 and 14 during the curing operation(s). But, as described above, in some other embodiments, the non-electrically conductive adhesive members 18a and 18b do not flow into the gap G such that the non-electrically conductive adhesive members 18a and 18b do not extend within the gap G. The electrically conductive adhesive members 20a and 20b are joined to the respective lead surfaces 30 and 32 and the electrical component 16 such that the electrically conductive adhesive members 20a and 20b electrically connect the electrical component 16 between the ends 22 and 24 of the leads 12 and 14, respectively. Each of the adhesive members 18a, 18b, 20a, and 20b may be cured, whether together and/or in separate curing operations, using any suitable curing process that enables the members 18a, 18b, 20a, and/or 20b to function as described and/or illustrated herein.

Figure 5:
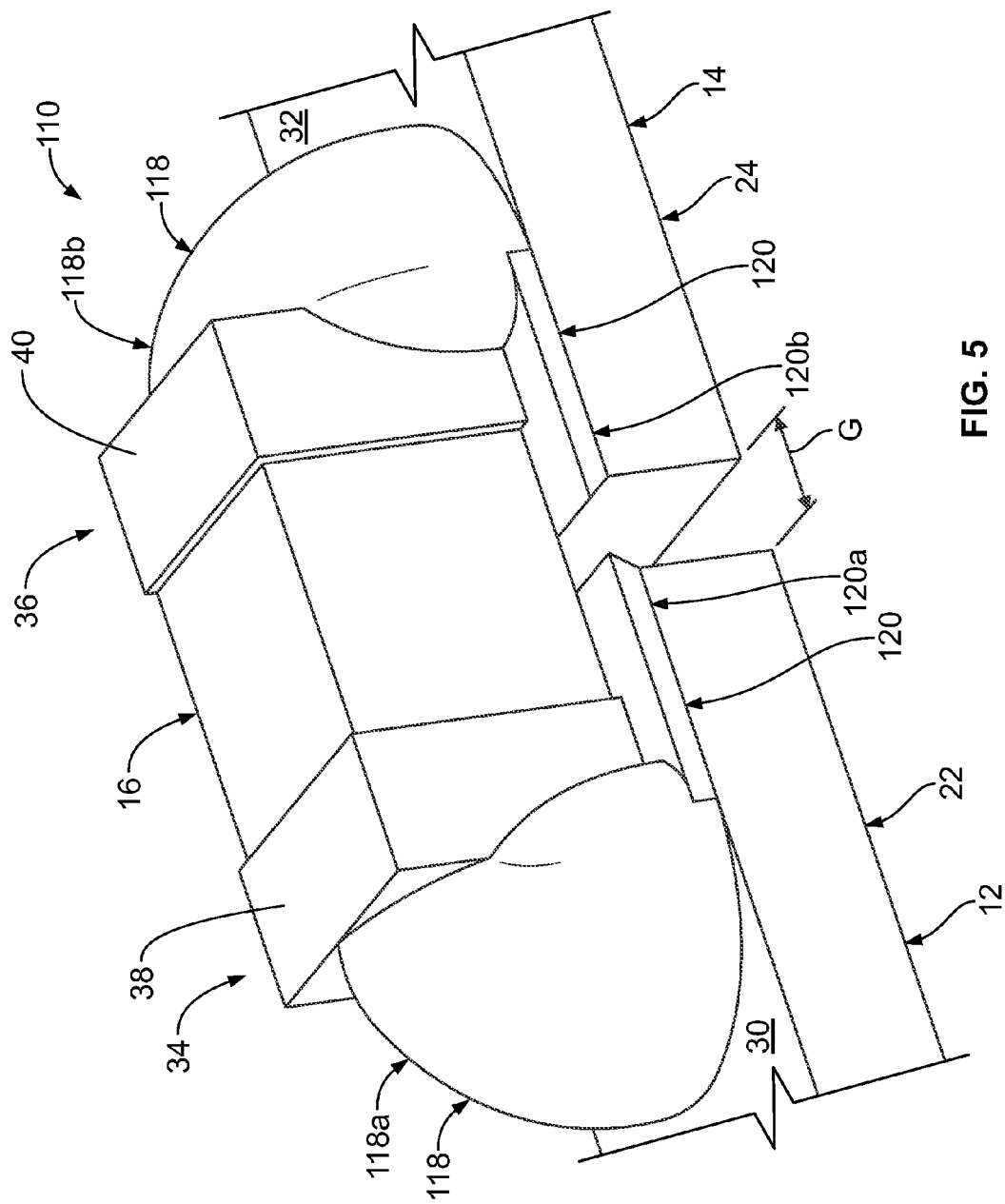
FIG. 5 is a perspective view of another embodiment of an electrical assembly.

FIG. 5 is a perspective view of another embodiment of an electrical assembly 110. The electrical assembly 110 includes the leads 12 and 14 and the electrical component 16, which electrically connects the leads 12 and 14 together. The electrical component 16 is mechanically connected to the leads 12 and 14 using one or more non-electrically conductive adhesive members 118. The electrical component 16 is electrically connected to the leads 12 and 14 using electrically conductive adhesive members 120. FIG. 5 illustrates an embodiment having the reverse arrangement of the adhesive members 18 and 20 (FIG. 1) of the electrical assembly 10 (FIGS. 1-4). Specifically, FIG. 5 illustrates an embodiment wherein the non-electrically conductive adhesive members 118 extend over the corresponding electrically conductive adhesive member(s) 120.

The electrical component 16 is electrically connected to the leads 12 and 14 using two electrically conductive adhesive members 120a and 120b. The electrically conductive adhesive member 120a joins the lead surface 30 of the lead 12 to the end 34 of the electrical component 16 such that the electrically conductive adhesive member 120a electrically connects the lead 12 to the end 34 of the electrical component 16. In the illustrated embodiment of the assembly 110, the electrically conductive adhesive member 120a joins the lead surface 30 of the lead 12 to the cap 38 at the end 34 of the electrical component 16 to electrically connect the lead 12 to the end 34 of the electrical component 16. The electrically conductive adhesive member 120a is not limited to joining the lead surface 30 of the lead 12 to the electrical component 16. Rather, in addition or alternatively to the lead surface 30, the electrically conductive adhesive member 120a may join any other surface of the lead 12 to the electrical component 16 to electrically connect the lead 12 to the electrical component 16. The electrically conductive adhesive member 120a may be referred to herein as a "first electrically conductive adhesive member" and/or a "second electrically conductive adhesive member".

The electrically conductive adhesive member 120b joins the lead surface 32 of the lead 14 to the end 36 of the electrical component 16. The electrically conductive adhesive member 120b thereby electrically connects the lead 14 to the end 36 of the electrical component 16. In the illustrated embodiment of the assembly 110, the electrically conductive adhesive member 120b joins the lead surface 32 of the lead 14 to the cap 40 at the end of the electrical component 16. The electrically conductive adhesive member 120b is not limited to joining the lead surface 32 of the lead 14 to the electrical component 16. Rather, in addition or alternatively to the lead surface 32, the electrically conductive adhesive member 120b may join any other surface of the lead 14 to the electrical component 16 to electrically connect the lead 14 to the electrical component 16. The electrically conductive adhesive member 120b may be referred to herein as a "first electrically conductive adhesive member" and/or a "second electrically conductive adhesive member".

The electrically conductive adhesive members 120a and 120b may each be any type of adhesive that is electrically conductive and that includes any material(s), such as, but not limited to, an electrically conductive epoxy, an electrically conductive thermosetting polymer, solder, a mechanically bonding adhesive, a chemically bonding adhesive, and/or the like. In some embodiments, the electrically conductive adhesive members 120a and 120b have the same material composition as each other, while in other embodiments the electrically conductive adhesive members 120a and 120b have a different material composition than each other.

In the illustrated embodiment of the assembly 110, the electrical component 16 is mechanically connected to the leads 12 and 14 using two non-electrically conductive adhesive members 118a and 118b. Specifically, the non-electrically conductive adhesive member 118a joins the lead surface 30 of the lead 12 to the end 34 of the electrical component 16. The non-electrically conductive adhesive member 118a thereby mechanically connects the lead 12 to the end 34 of the electrical component 16. In the illustrated embodiment of the assembly 110, the non-electrically conductive adhesive member 118a joins the lead surface 30 of the lead 12 to the cap 38 at the end 34 of the electrical component 16 to mechanically connect the lead 12 to the end 34 of the electrical component 16. The non-electrically conductive adhesive member 118a is not limited to joining the lead surface 30 of the lead 12 to the electrical component 16. Rather, in addition or alternatively to the lead surface 30, the non-electrically conductive adhesive member 118a may join any other surface of the lead 12 to the electrical component 16 to mechanically connect the lead 12 to the electrical component 16. The non-electrically conductive adhesive member 118a may be referred to herein as a "first non-electrically conductive adhesive member" and/or a "second non-electrically conductive adhesive member".

The non-electrically conductive adhesive member 118b joins the lead surface 32 of the lead 14 to the end 36 of the electrical component 16 such that the non-electrically conductive adhesive member 118b mechanically connects the lead 14 to the end 36 of the electrical component 16. The non-electrically conductive adhesive member 118b joins the lead surface 32 of the lead 14 to the cap 40 at the end of the electrical component 16 in the illustrated embodiment of the assembly 10. The non-electrically conductive adhesive member 118b is not limited to joining the lead surface 32 of the lead 14 to the electrical component 16. Rather, in addition or alternatively to the lead surface 32, the non-electrically conductive adhesive member 118b may join any other surface of the lead 14 to the electrical component 16 to mechanically connect the lead 14 to the electrical component 16. The non-electrically conductive adhesive member 118b may be referred to herein as a "first non-electrically conductive adhesive member" and/or a "second non-electrically conductive adhesive member".

The non-electrically conductive adhesive members 118a and 118b may each be any type of adhesive that is not electrically conductive and that includes any material(s), such as, but not limited to, an epoxy, a thermosetting polymer, a mechanically bonding adhesive, a chemically bonding adhesive, and/or the like. In some embodiments, the non-electrically conductive adhesive members 118a and 118b have the same material composition as each other, while in other embodiments the non-electrically conductive adhesive members 118a and 118b have a different material composition than each other.

In the illustrated embodiment of the assembly 110, each of the electrically conductive adhesive members 120a and 120b extends between the respective lead surface 30 and 32 and the respective non-electrically conductive adhesive member 118a and 118b. In other words, the non-electrically conductive adhesive members 118a and 118b extend over the respective electrically conductive adhesive member 120a and 120b.

Optionally, an electrically insulative material (not shown) is provided that encapsulates at least a portion of the electrical assembly 110, such as, but not limited to, the electrical component 16, the non-electrically conductive adhesive members 118a and 118b, the electrically conductive adhesive members 120a and 120b, and at least a portion of the leads 12 and 14 (e.g., the ends 22 and 24 of the leads 12 and 14, respectively). For example, the electrically insulative material may be an overmold that is molded over at least a portion of the electrical assembly 110.

Figure 6:
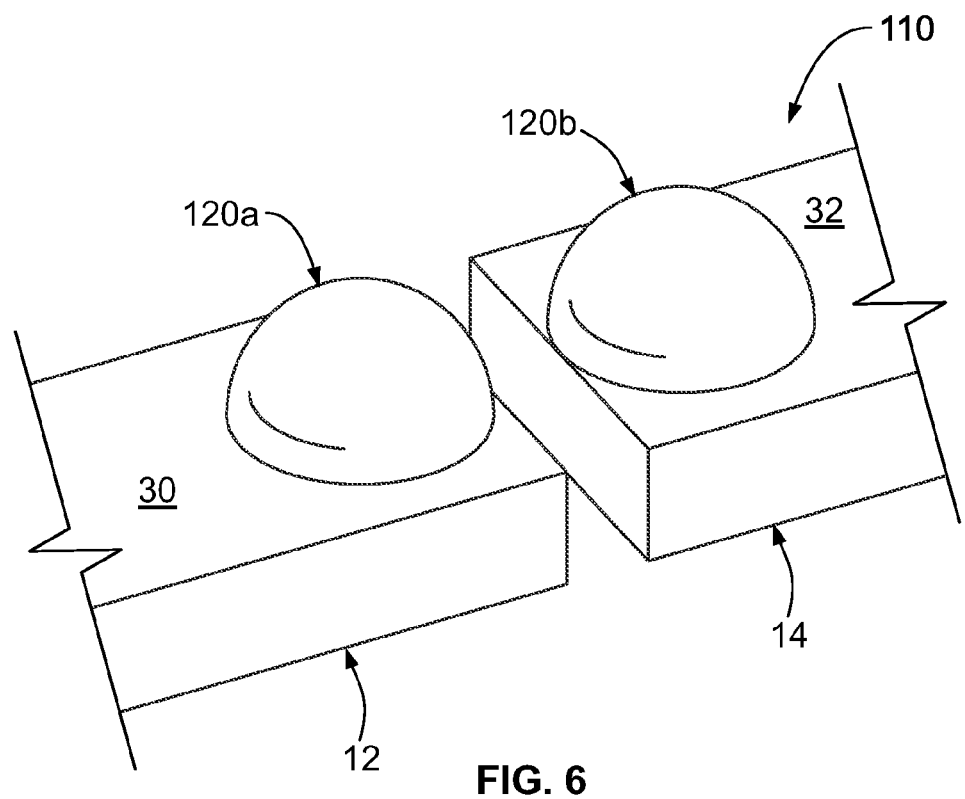
FIGS. 6-8 are perspective views of portions of the electrical assembly shown in FIG. 1 illustrating an exemplary process for fabricating the assembly.
Figure 7:
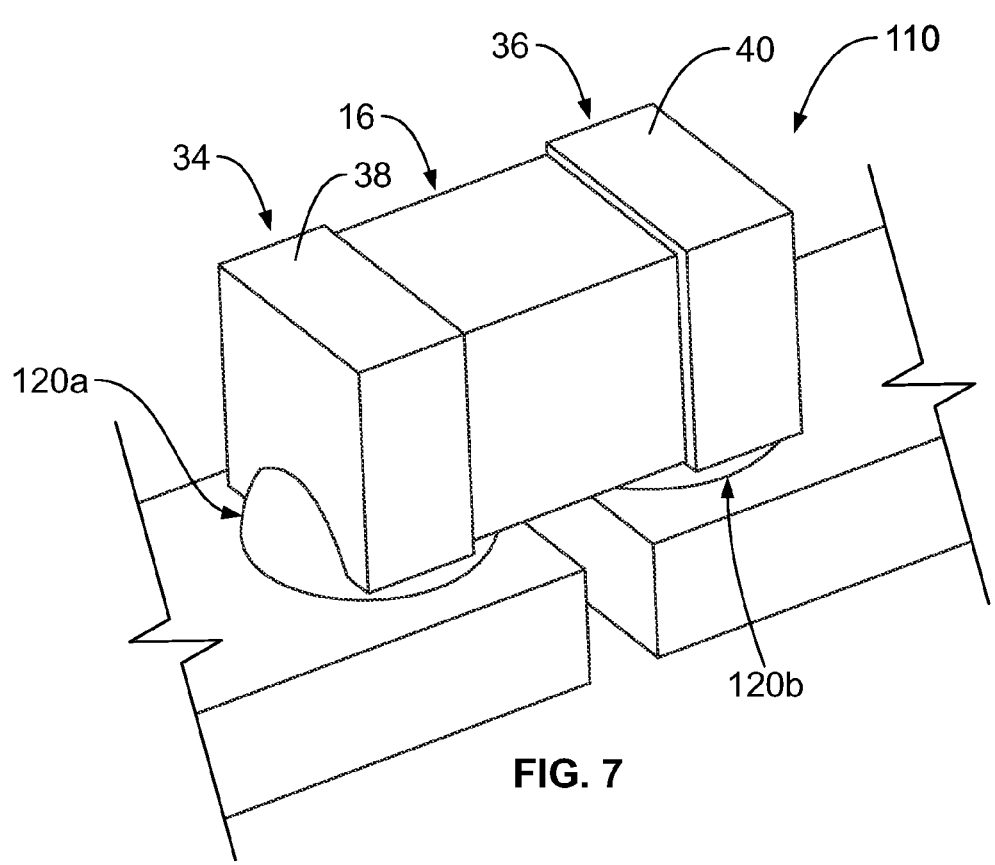
Figure 8:
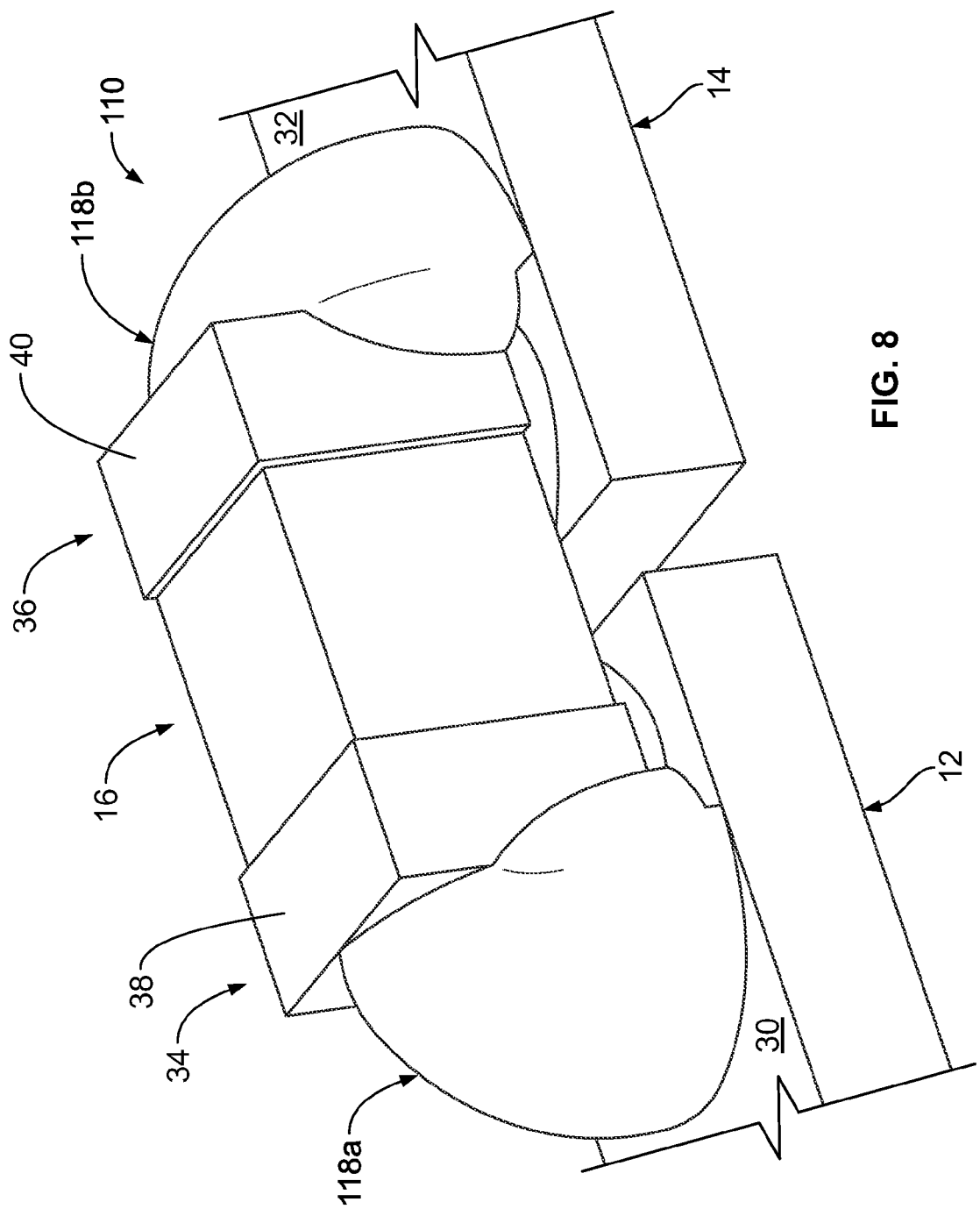

FIGS. 6-8 are perspective views of portions of the electrical assembly 110 illustrating an exemplary process for fabricating the assembly 110. As shown in FIG. 6, a dot of an electrically conductive adhesive material is applied to the lead surface 30 of the lead 12 to provide the electrically conductive adhesive member 120a. Similarly, a dot of an electrically conductive adhesive material is applied to the lead surface 32 of the lead 14 to provide the electrically conductive adhesive member 120b.

As shown in FIG. 7, the electrical component 16 is placed on the electrically conductive adhesive members 120a and 120b. Specifically, the electrical component 16 is positioned on the electrically conductive adhesive members 120a and 120b such that the end 34 of the electrical component 16 is engaged in physical contact with the electrically conductive adhesive member 120a and such that the end 36 of the electrical component 16 is engaged in physical contact with the electrically conductive adhesive member 120b. In the illustrated embodiment, the cap 38 at the end 34 of the electrical component 16 is engaged in physical contact with the electrically conductive adhesive member 120a and the cap 40 at the end 36 of the electrical component 16 is engaged in physical contact with the electrically conductive adhesive member 120b.

As shown in FIG. 8, a dot of a non-electrically conductive adhesive material is applied to the lead 12 and the electrical component 16 to provide the non-electrically conductive adhesive member 118a. Specifically, the non-electrically conductive adhesive material is applied to the lead 12 and the electrical component 16 such that the non-electrically conductive adhesive member 118a is engaged in physical contact with the lead surface 30 of the lead 12 and is engaged in physical contact with the end 34 of the electrical component 16. In the illustrated embodiment, the non-electrically conductive adhesive member 118a is engaged in physical contact with the cap 38 at the end 34 of the electrical component 16.

A dot of a non-electrically conductive adhesive material is also applied to the lead 14 and the electrical component 16 to provide the non-electrically conductive adhesive member 118b, as is also shown in FIG. 8. Specifically, the non-electrically conductive adhesive material is applied to the lead 14 and the electrical component 16 such that the non-electrically conductive adhesive member 118b is engaged in physical contact with the lead surface 32 of the lead 14 and is engaged in physical contact with the end 36 of the electrical component 16. In the illustrated embodiment, the non-electrically conductive adhesive member 118b is engaged in physical contact with the cap 40 at the end 36 of the electrical component 16.

The adhesive members 118a, 118b, 120a, and/or 120b can then be cured to provide the electrical assembly 110 shown in FIG. 5. Referring now to FIG. 5, the non-electrically conductive adhesive members 118a and 118b are joined to the respective lead surfaces 30 and 32 and the electrical component 16 such that the non-electrically conductive adhesive members 118a and 118b mechanically connect the electrical component 16 between the ends 22 and 24 of the leads 12 and 14, respectively. The electrically conductive adhesive members 120a and 120b are joined to the respective lead surfaces 30 and 32 and the electrical component 16 such that the electrically conductive adhesive members 120a and 120b electrically connect the electrical component 16 between the ends 22 and 24 of the leads 12 and 14, respectively. As shown in FIG. 5, the electrically conductive adhesive members 120a and 120b are not directly electrically connected together (e.g., do not bridge the gap G between the leads 12 and 14) such that the electrically conductive adhesive members 120a and 120b do not electrical short the leads 12 and 14 together (i.e., do not provide an electrical path between the leads 12 and 14 that bypasses the electrical component 16). Each of the adhesive members 118a, 118b, 120a, and 120b may be cured, whether together and/or in separate curing operations, using any suitable curing process that enables the members 118a, 118b, 120a, and/or 120b to function as described and/or illustrated herein.

Figure 9:
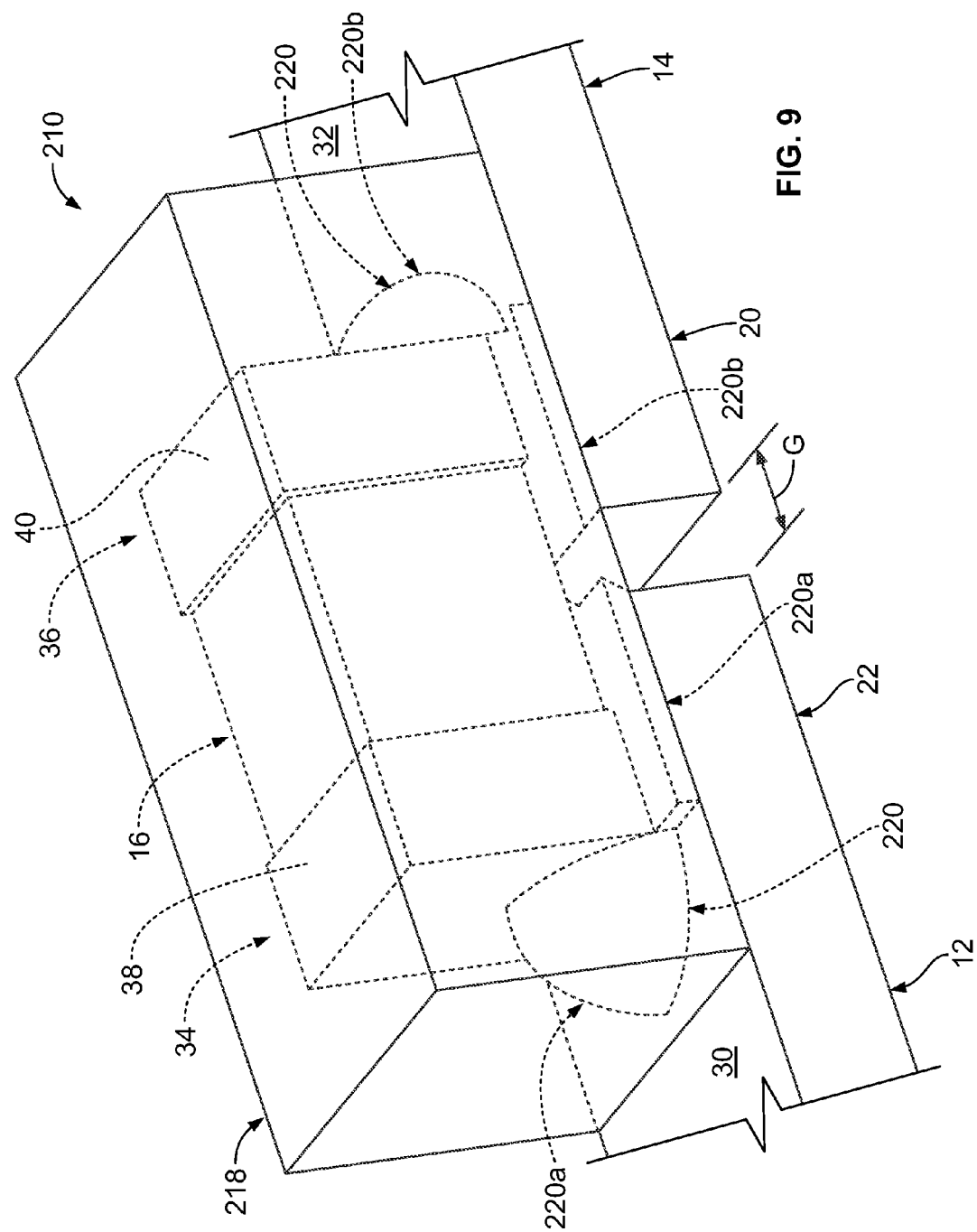
FIG. 9 is a perspective view of another embodiment of an electrical assembly.

FIG. 9 is a perspective view of another embodiment of an electrical assembly 210. The electrical assembly 210 includes the leads 12 and 14 and the electrical component 16, which electrically connects the leads 12 and 14 together. The electrical component 16 is mechanically connected to the leads 12 and 14 using a non-electrically conductive adhesive member 218. The electrical component 16 is electrically connected to the leads 12 and 14 using electrically conductive adhesive members 220. FIG. 9 illustrates an embodiment wherein the non-electrically conductive adhesive member 218 is a single continuous structure that encapsulates the electrical component 16, the electrically conductive adhesive members 220, and at least a portion of the leads 12 and 14.

The electrical component 16 is electrically connected to the leads 12 and 14 using two electrically conductive adhesive members 220a and 220b. The electrically conductive adhesive member 220a joins the lead surface 30 of the lead 12 to the end 34 of the electrical component 16 such that the electrically conductive adhesive member 220a electrically connects the lead 12 to the end 34 of the electrical component 16. In the illustrated embodiment of the assembly 210, the electrically conductive adhesive member 220a joins the lead surface 30 of the lead 12 to the cap 38 at the end 34 of the electrical component 16 to electrically connect the lead 12 to the end 34 of the electrical component 16. The electrically conductive adhesive member 220a is not limited to joining the lead surface 30 of the lead 12 to the electrical component 16. Rather, in addition or alternatively to the lead surface 30, the electrically conductive adhesive member 220a may join any other surface of the lead 12 to the electrical component 16 to electrically connect the lead 12 to the electrical component 16. The electrically conductive adhesive member 220a may be referred to herein as a "first electrically conductive adhesive member" and/or a "second electrically conductive adhesive member".

The electrically conductive adhesive member 220b joins the lead surface 32 of the lead 14 to the end 36 of the electrical component 16. The electrically conductive adhesive member 220b thereby electrically connects the lead 14 to the end 36 of the electrical component 16. In the illustrated embodiment of the assembly 210, the electrically conductive adhesive member 220b joins the lead surface 32 of the lead 14 to the cap 40 at the end of the electrical component 16. The electrically conductive adhesive member 220b is not limited to joining the lead surface 32 of the lead 14 to the electrical component 16. Rather, in addition or alternatively to the lead surface 32, the electrically conductive adhesive member 220b may join any other surface of the lead 14 to the electrical component 16 to electrically connect the lead 14 to the electrical component 16. The electrically conductive adhesive member 220b may be referred to herein as a "first electrically conductive adhesive member" and/or a "second electrically conductive adhesive member".

The electrically conductive adhesive members 220a and 220b may each be any type of adhesive that is electrically conductive and that includes any material(s), such as, but not limited to, an electrically conductive epoxy, an electrically conductive thermosetting polymer, solder, a mechanically bonding adhesive, a chemically bonding adhesive, and/or the like. In some embodiments, the electrically conductive adhesive members 220a and 220b have the same material composition as each other, while in other embodiments the electrically conductive adhesive members 220a and 220b have a different material composition than each other.

In the illustrated embodiment of the assembly 210, the electrical component 16 is mechanically connected to the leads 12 and 14 using the non-electrically conductive adhesive member 218. As shown in FIG. 9, the non-electrically conductive adhesive member 218 is a single continuous structure that encapsulates the electrical component 16, the electrically conductive adhesive members 220, and at least a portion of the leads 12 and 14. In the illustrated embodiment of the assembly 210, the non-electrically conductive adhesive member 218 encapsulates portions of the ends 22 and 24 of the leads 12 and 14, respectively, but the non-electrically conductive adhesive material 218 may encapsulate less of the ends 22 and/or 24, more of the ends 22 and/or 24, more of the leads 12 and/or 14 overall, and/or less of the leads 12 and/or 14 overall. The non-electrically conductive adhesive member 218 may encapsulate any amount(s) and/or portion(s) of the leads 12 and 14.

Optionally, the non-electrically conductive adhesive member 218 extends within the gap G. The non-electrically conductive adhesive member 218 may fill any amount of the gap G. In the illustrated embodiment of the assembly 210, the non-electrically conductive adhesive member 218 fills an approximate entirety of the 3D space of the gap G.

The material of the non-electrically conductive adhesive member 218 joins the lead surface 30 of the lead 12 to the end 34 of the electrical component 16. The non-electrically conductive adhesive member 218 thereby mechanically connects the lead 12 to the end 34 of the electrical component 16. The material of the non-electrically conductive adhesive member 218 also joins the lead surface 32 of the lead 14 to the end 36 of the electrical component 16 such that the non-electrically conductive adhesive member 218 mechanically connects the lead 14 to the end 36 of the electrical component 16.

The non-electrically conductive adhesive member 218 may be any type of adhesive that is not electrically conductive and that includes any material(s), such as, but not limited to, an epoxy, a thermosetting polymer, a mechanically bonding adhesive, a chemically bonding adhesive, and/or the like.

Optionally, an electrically insulative material (not shown) is provided that encapsulates at least a portion of the electrical assembly 210, such as, but not limited to, the electrical component 16, the non-electrically conductive adhesive member 218, the electrically conductive adhesive members 220a and 220b, and at least a portion of the leads 12 and 14. For example, the electrically insulative material may be an overmold that is molded over at least a portion of the electrical assembly 210.

Figure 10:
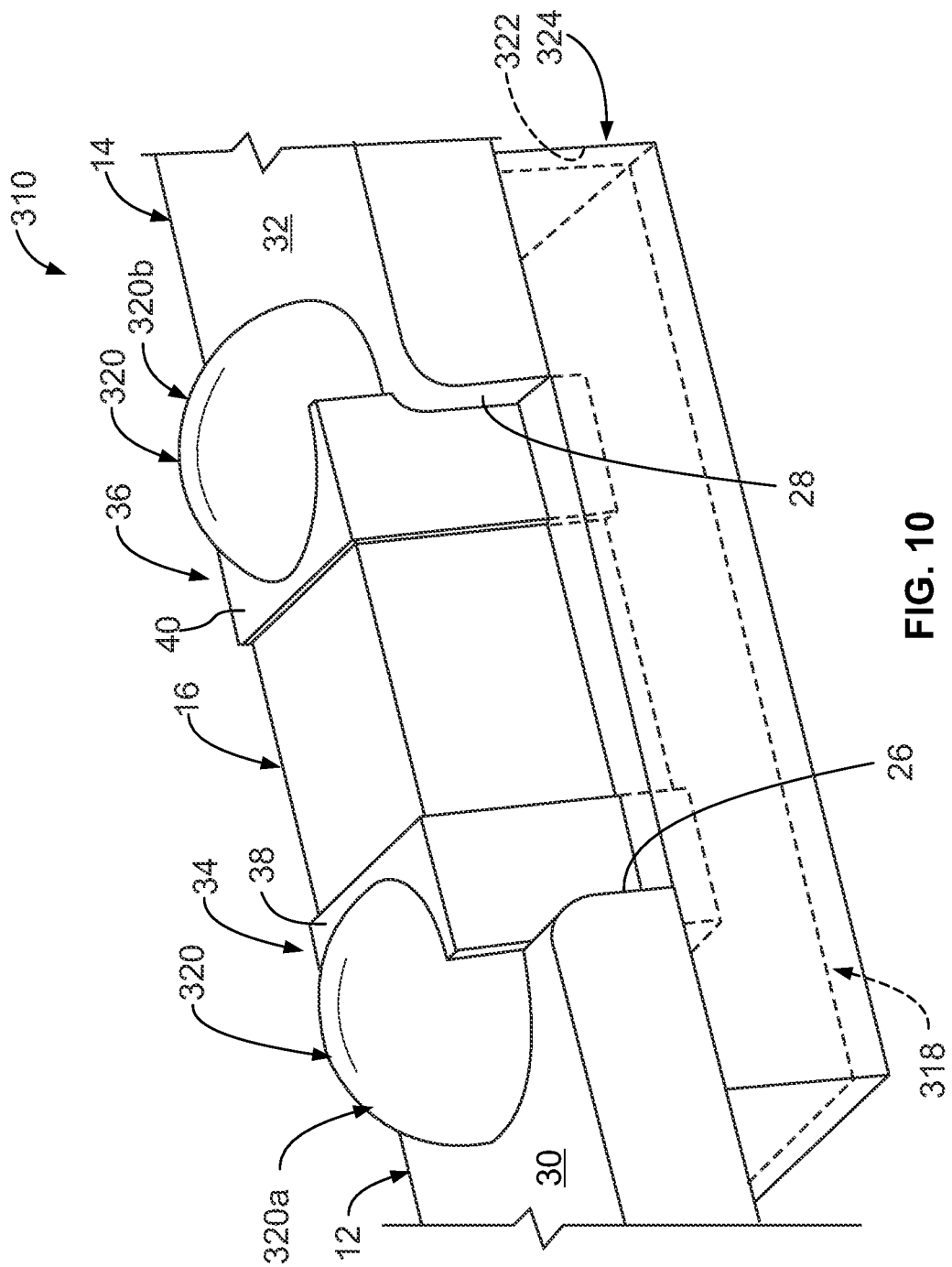
FIG. 10 is a perspective view of another embodiment of an electrical assembly.

FIG. 10 is a perspective view of another embodiment of an electrical assembly 310. The electrical assembly 310 includes the leads 12 and 14 and the electrical component 16, which electrically connects the leads 12 and 14 together. The electrical component 16 is mechanically connected to the leads 12 and 14 using a non-electrically conductive adhesive member 318. The electrical component 16 is electrically connected to the leads 12 and 14 using electrically conductive adhesive members 320. FIG. 10 illustrates an embodiment wherein the non-electrically conductive adhesive member 318 is a single continuous structure that is positioned within a reservoir 322 of a larger electrical device 324 within which the electrical assembly 310 is embedded. The electrical device 324 may be any type of electrical device, such as, but not limited to, an electrical connector, a circuit board, and/or the like.

In the illustrated embodiment of the assembly 310, the electrical component 16 is mechanically connected to the leads 12 and 14 using the non-electrically conductive adhesive member 318. As shown in FIG. 10, the non-electrically conductive adhesive member 318 is a single continuous structure that extends within the reservoir 322 of the electrical device 324. The reservoir 322 may be any reservoir of the electrical device 324. In the illustrated embodiment of the assembly 310, the reservoir 322 extends within a stuffer block of the electrical device 324 that is used to hold a lead frame (which includes the leads 12 and 14) of the electrical device 324.

The material of the non-electrically conductive adhesive member 318 joins the lead 12 to the end 34 of the electrical component 16. The non-electrically conductive adhesive member 318 thereby mechanically connects the lead 12 to the end 34 of the electrical component 16. In the illustrated embodiment of the assembly 310, the non-electrically conductive adhesive member 318 joins the lead 12 to the cap 38 at the end 34 of the electrical component 16 to mechanically connect the lead 12 to the end 34 of the electrical component 16.

The material of the non-electrically conductive adhesive member 318 joins the lead 14 to the end 36 of the electrical component 16 such that the non-electrically conductive adhesive member 318 mechanically connects the lead 14 to the end 36 of the electrical component 16. In the illustrated embodiment of the assembly 310, the non-electrically conductive adhesive member 318 joins the lead 14 to the cap 40 at the end 36 of the electrical component 16 to mechanically connect the lead 14 to the end 36 of the electrical component 16.

In the illustrated embodiment of the assembly 310, the electrical component 16 is press-fit between the end faces 26 and 28 of the leads 12 and 14, respectively. Accordingly, the ends 34 and 36 of the electrical component 16 are engaged in physical contact with the respective end faces 26 and 28 in the illustrated embodiment of the assembly 310. But, the electrical component 16 is not limited to being press-fit between the end faces 26 and 28. Rather, the electrical component 16 may extend between the leads 12 and 14 with a clearance fit wherein the ends 34 and 36 of the electrical component 16 are spaced apart from the end faces 26 and 28, respectively, of the leads 12 and 14, respectively.

The non-electrically conductive adhesive member 318 may be any type of adhesive that is not electrically conductive and that includes any material(s), such as, but not limited to, an epoxy, a thermosetting polymer, a mechanically bonding adhesive, a chemically bonding adhesive, and/or the like.

The electrical component 16 is electrically connected to the leads 12 and 14 using two electrically conductive adhesive members 320a and 320b. The electrically conductive adhesive member 320a joins the lead surface 30 of the lead 12 to the end 34 of the electrical component 16 such that the electrically conductive adhesive member 320a electrically connects the lead 12 to the end 34 of the electrical component 16. In the illustrated embodiment of the assembly 310, the electrically conductive adhesive member 320a joins the lead surface 30 of the lead 12 to the cap 38 at the end 34 of the electrical component 16 to electrically connect the lead 12 to the end 34 of the electrical component 16. The electrically conductive adhesive member 320a is not limited to joining the lead surface 30 of the lead 12 to the electrical component 16. Rather, in addition or alternatively to the lead surface 30, the electrically conductive adhesive member 320a may join any other surface of the lead 12 to the electrical component 16 to electrically connect the lead 12 to the electrical component 16. The electrically conductive adhesive member 320a may be referred to herein as a "first electrically conductive adhesive member" and/or a "second electrically conductive adhesive member".

The electrically conductive adhesive member 320b joins the lead surface 32 of the lead 14 to the end 36 of the electrical component 16. The electrically conductive adhesive member 320b thereby electrically connects the lead 14 to the end 36 of the electrical component 16. In the illustrated embodiment of the assembly 310, the electrically conductive adhesive member 320b joins the lead surface 32 of the lead 14 to the cap 40 at the end of the electrical component 16. The electrically conductive adhesive member 320b is not limited to joining the lead surface 32 of the lead 14 to the electrical component 16. Rather, in addition or alternatively to the lead surface 32, the electrically conductive adhesive member 320b may join any other surface of the lead 14 to the electrical component 16 to mechanically connect the lead 14 to the electrical component 16. The electrically conductive adhesive member 320b may be referred to herein as a "first electrically conductive adhesive member" and/or a "second electrically conductive adhesive member".

The electrically conductive adhesive members 320a and 320b may each be any type of adhesive that is electrically conductive and that includes any material(s), such as, but not limited to, an electrically conductive epoxy, an electrically conductive thermosetting polymer, solder, a mechanically bonding adhesive, a chemically bonding adhesive, and/or the like. In some embodiments, the electrically conductive adhesive members 320a and 320b have the same material composition as each other, while in other embodiments the electrically conductive adhesive members 320a and 320b have a different material composition than each other.

Optionally, an electrically insulative material (not shown) is provided that encapsulates at least a portion of the electrical assembly 310, such as, but not limited to, the electrical component 16, the non-electrically conductive adhesive member 318, the electrically conductive adhesive members 320a and 320b, and at least a portion of the leads 12 and 14. For example, the electrically insulative material may be an overmold that is molded over at least a portion of the electrical assembly 310.

Figure 11:
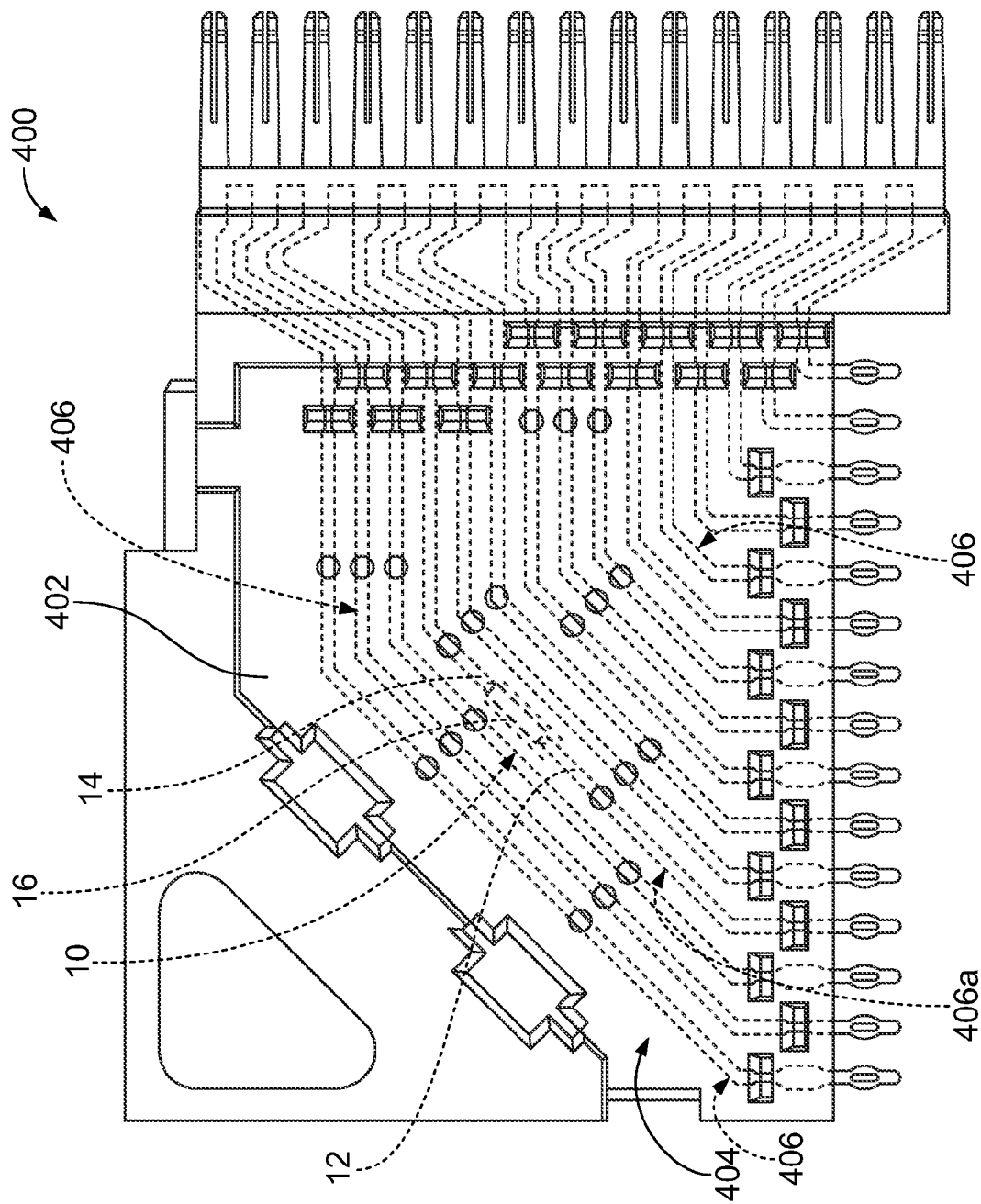
FIG. 11 is a perspective view of an embodiment of an electrical connector.

Optionally, each of the electrical assemblies described and/or illustrated herein may be embedded within a larger electrical device, which may be any type of electrical device, such as, but not limited to, and electrical connector, a circuit board, and/or the like. FIG. 11 is a perspective view of an embodiment of an electrical connector 400 within which the electrical assemblies described and/or illustrated herein (e.g., the assembly 10 shown in FIGS. 1-4, the assembly 110 shown in FIGS. 5-8, the assembly 210 shown in FIG. 9, and/or the assembly 310 shown in FIG. 10) may be embedded. The electrical connector 400 is meant as exemplary only. The electrical assemblies described and/or illustrated herein are not limited to being embedded within the electrical connector 400, but rather may be embedded within any other type of electrical connector and/or other electrical device.

The electrical connector 400 includes an electrically insulative body 402 and a lead frame 404 held by the body 402. The lead frame 404 includes a plurality of leads 406. In the illustrated embodiment, the electrical assembly 10 is embedded within the lead frame 404 of the electrical connector 400. Specifically, one of the leads 406a includes the leads 12 and 14, which are sub-leads of the lead 406a. The electrical component 16 of the electrical assembly 10 is electrically and mechanically connected between the leads 12 and 14 as described above and illustrated in FIG. 1. In addition or alternatively to the electrical assembly 10, it should be understood that the electrical assembly 110, the electrical assembly 210, and/or the electrical assembly 310 may be embedded within the lead frame 404 of the electrical connector 400. The body 402 of the electrical connector 400 may provide all or one or more portions of the electrically insulative material that optionally encapsulates at least a portion of the electrical assembly 10.

The embodiments described and/or illustrated herein may provide an electrical assembly that is better capable of experiencing mechanical stresses during handling and processing operations without failing (e.g., without breaking an electrical and/or mechanical connection between an electrical component and one or both leads of the assembly), for example as compared to at least some known electrical assemblies. For example, the mechanical strength provided by the non-electrically conductive adhesive members described and/or illustrated herein may provide mechanical support to the electrically conductive adhesive members described and/or illustrated herein, which may prevent the electrical connections between the electrical component and the leads from being broken. Moreover, the mechanical strength provided by the non-electrically conductive adhesive members described and/or illustrated herein may prevent the mechanical connections between the electrical component and the leads from being broken.

The embodiments described and/or illustrated herein may provide an electrical assembly having electrical leads that are less likely to be electrically shorted together by electrically conductive adhesive members of the electrical assembly, for example as compared to at least some known electrical assemblies.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical assembly comprising: a first lead; a second lead; an electrical component extending from a first end to a second end that is opposite the first end; a first non-electrically conductive adhesive member joining the first lead to the first end of the electrical component such that the first non-electrically conductive adhesive member mechanically connects the first lead to the first end of the electrical component; a second non-electrically conductive adhesive member joining the second lead to the second end of the electrical component such that the second non-electrically conductive adhesive member mechanically connects the second lead to the second end of the electrical component; a first electrically conductive adhesive member joining the first lead to the first end of the electrical component such that the first electrically conductive adhesive member electrically connects the first lead to the first end of the electrical component; and a second electrically conductive adhesive member joining the second lead to the second end of the electrical component such that the second electrically conductive adhesive member electrically connects the second lead to the second end of the electrical component, wherein the first and second leads are spaced apart by a gap, at least one of the first non-electrically conductive adhesive member or the second non-electrically conductive adhesive member extending within the gap such that the gap is approximately entirely filled by the at least one of the first non-electrically conductive adhesive member or the second non-electrically conductive adhesive member.

2. The electrical assembly of claim 1, wherein the first and second leads are spaced apart by a gap, at least one of the first non-electrically conductive adhesive member or the second non-electrically conductive adhesive member extending within the gap.

3. The electrical assembly of claim 1, wherein the first non-electrically conductive adhesive member extends between the first lead and the first electrically conductive adhesive member, the second non-electrically conductive adhesive member extending between the second lead and the second electrically conductive adhesive member.

4. The electrical assembly of claim 1, wherein at least one of the first non-electrically conductive adhesive member or the second non-electrically conductive adhesive member comprises at least one of an epoxy or a thermosetting polymer.

5. The electrical assembly of claim 1, wherein at least one of the first electrically conductive adhesive member or the second electrically conductive adhesive member comprise at least one of an electrically conductive epoxy, an electrically conductive thermosetting polymer, or solder.

6. The electrical assembly of claim 1, wherein the first and second leads are leads of a lead frame of an electrical connector.

7. The electrical assembly of claim 1, wherein the first and second leads comprise end faces that are spaced apart by a gap, at least one of the first non-electrically conductive adhesive member or the second non-electrically conductive adhesive member joining the end faces together across the gap.

8. The electrical assembly of claim 1, wherein the first and second non-electrically conductive adhesive members define a continuous structure.

9. The electrical assembly of claim 1, wherein at least one of the first and second non-electrically conductive adhesive members have the same material composition as each other or the first and second electrically conductive adhesive members have the same material composition as each other.

10. The electrical assembly of claim 1, wherein the electrical component comprises at least one of a capacitor, a resistor, a diode, a transistor, a transducer, a switch, an active electrical component, or a passive electrical component.

11. The electrical assembly of claim 1, wherein the first lead comprises a first lead surface, the first non-electrically conductive adhesive member joining the first lead surface to the first end of the electrical component, the first electrically conductive adhesive member joining the first lead surface to the first end of the electrical component.

12. The electrical assembly of claim 1, wherein the second lead comprises a second lead surface, the second non-electrically conductive adhesive member joining the second lead surface to the second end of the electrical component, the second electrically conductive adhesive member joining the second lead surface to the second end of the electrical component.

13. An electrical connector comprising; an electrically insulative body; a lead frame held by the body, the lead frame comprising first and second leads; and an electrical assembly embedded within the lead frame, the electrical assembly comprising: an electrical component extending from a first end to a second end that is opposite the first end; a first non-electrically conductive adhesive member joining the first lead to the first end of the electrical component such that the first non-electrically conductive adhesive member mechanically connects the first lead to the first end of the electrical component; a second non-electrically conductive adhesive member joining the second lead to the second end of the electrical component such that the second non-electrically conductive adhesive member mechanically connects the second lead to the second end of the electrical component; a first electrically conductive adhesive member joining the first lead to the first end of the electrical component such that the first electrically conductive adhesive member electrically connects the first lead to the first end of the electrical component; and a second electrically conductive adhesive member joining the second lead to the second end of the electrical component such that the second electrically conductive adhesive member electrically connects the second lead to the second end of the electrical component; wherein the first and second leads are spaced apart by a gap, at least one of the first non-electrically conductive adhesive member or the second non-electrically conductive adhesive member extending within the gap.

14. The electrical connector of claim 13, wherein the first non-electrically conductive adhesive member extends between the first lead surface and the first electrically conductive adhesive member, the second non-electrically conductive adhesive member extending between the second lead surface and the second electrically conductive adhesive member.

15. The electrical connector of claim 13, wherein at least one of the first non-electrically conductive adhesive member or the second non-electrically conductive adhesive member comprises at least one of an epoxy or a thermosetting polymer, at least one of the first electrically conductive adhesive member or the second electrically conductive adhesive member comprising at least one of an electrically conductive epoxy, an electrically conductive thermosetting polymer, or solder.

16. The electrical connector of claim 13, wherein the electrical component comprises at least one of a capacitor, a resistor, a diode, a transistor, a transducer, a switch, an active electrical component, or a passive electrical component.

17. An electrical assembly comprising: a first lead; a second lead, wherein the first and second leads are spaced apart by a gap; an electrical component extending from a first end to a second end that is opposite the first end; a non-electrically conductive adhesive member joining the first lead to the first end of the electrical component such that the non-electrically conductive adhesive member mechanically connects the first lead to the first end of the electrical component, the non-electrically conductive adhesive member joining the second lead to the second end of the electrical component such that the non-electrically conductive adhesive member mechanically connects the second lead to the second end of the electrical component, the non-electrically conductive adhesive member joining the first and second leads together across the gap; a first electrically conductive adhesive member joining the first lead to the first end of the electrical component such that the first electrically conductive adhesive member electrically connects the first lead to the first end of the electrical component; and a second electrically conductive adhesive member joining the second lead to the second end of the electrical component such that the second electrically conductive adhesive member electrically connects the second lead to the second end of the electrical component; wherein the non-electrically conductive adhesive member is a single continuous structure that encapsulates the electrical component, the first and second electrically conductive adhesive members, and at least a portion of the first and second leads.

* * * * *